(12) United States Patent
Ubaradka et al.

(10) Patent No.: US 8,629,692 B1
(45) Date of Patent: Jan. 14, 2014

(54) STATE DEFINITION AND RETENTION CIRCUIT

(75) Inventors: Jayarama Ubaradka, Bangalore (IN); Dharmaray M. Nedalgi, Bangalore (IN)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/536,638

(22) Filed: Jun. 28, 2012

(51) Int. Cl.
*H03K 19/0175* (2006.01)

(52) U.S. Cl.
USPC .................. 326/81; 326/68; 326/80

(58) Field of Classification Search
USPC ......... 326/62–63, 68, 80–83, 86–87; 327/333
See application file for complete search history.

(56) References Cited

U.S. PATENT DOCUMENTS

| | | | |
|---|---|---|---|
| 6,781,413 B2* | 8/2004 | Kihara et al. | 326/68 |
| 7,205,820 B1* | 4/2007 | Yeung et al. | 327/333 |
| 2006/0066381 A1* | 3/2006 | Bhattacharya et al. | 327/333 |
| 2007/0018710 A1* | 1/2007 | Choi et al. | 327/333 |

* cited by examiner

*Primary Examiner* — Jany Richardson

(57) ABSTRACT

State definition and retention circuits are described. In one embodiment, a circuit includes two cross-connected PMOS transistors, first, second, and third NMOS transistors coupled to the PMOS transistors, an inverter circuit, and an output transistor connected to the PMOS transistors and to an output terminal of the circuit. The second NMOS transistor is connected to an input terminal of the circuit. A drain terminal and a gate terminal of the third NMOS transistor are connected to gate terminals of the PMOS transistors. The inverter circuit is coupled to the first and second NMOS transistors and to the input terminal. The inverter circuit is connected between a first power supply and a first base voltage. The PMOS transistors, the NMOS transistors, and the output transistor are connected between a second power supply and a second base voltage. Other embodiments are also described.

17 Claims, 4 Drawing Sheets

STATE DEFINITION AND RETENTION CIRCUIT

Embodiments of the invention relate generally to electronic circuits and, more particularly, to state definition and retention circuits.

Power can be supplied to components of an integrated circuit (IC) by multiple power supplies. For example, components in an Input/Output (I/O) IC can be grouped into core circuit components such as signal processing units and I/O circuit components. Power is supplied to the core circuit components by a core power supply while power is supplied to the I/O circuit components by an I/O power supply.

However, multiple power supplies can have various power on/off combinations. Under each power on/off combination, an IC is required to define and/or retain its state. For example, the state of an I/O pin should be defined or retained under a power on/off combination of a core power supply and an I/O power supply. State definition and retention circuits are often used to ensure that the state of an I/O pin is defined and/or retained.

State definition and retention circuits are described. In one embodiment, a circuit includes two cross-connected p-channel metal oxide semiconductor field effect transistor (MOSFET) (PMOS) transistors, first, second, and third n-channel MOSFET (NMOS) transistors coupled to the two cross-connected PMOS transistors, an inverter circuit, and an output transistor connected to the two cross-connected PMOS transistors and to an output terminal of the circuit. The second NMOS transistor is connected to an input terminal of the circuit. A drain terminal and a gate terminal of the third NMOS transistor are connected to gate terminals of the two cross-connected PMOS transistors. The inverter circuit is coupled to the first and second NMOS transistors and to the input terminal. The inverter circuit is connected between a first power supply and a first base voltage. The two cross-connected PMOS transistors, the first, second, and third NMOS transistors, and the output transistor are connected between a second power supply and a second base voltage. Other embodiments are also described.

In an embodiment, a circuit includes two cross-connected PMOS transistors, first, second, and third NMOS transistors coupled to the two cross-connected PMOS transistors, an inverter circuit, and an output transistor connected to the two cross-connected PMOS transistors and to an output terminal of the circuit. A gate terminal of the second NMOS transistor is connected to an input terminal of the circuit. A drain terminal and a gate terminal of the third NMOS transistor are connected to gate terminals of the two cross-connected PMOS transistors. The inverter circuit is coupled to the first and second NMOS transistors and to the input terminal. An input terminal of the inverter circuit is connected to the gate terminal of the second NMOS transistor. An output terminal of the inverter circuit is connected to a gate terminal of the first NMOS transistor. The inverter circuit is connected between a first power supply and a first base voltage. The two cross-connected PMOS transistors, the first, second, and third NMOS transistors, and the output transistor are connected between a second power supply and a second base voltage. Source terminals of the two cross-connected PMOS transistors are connected to the second power supply. Source terminals of the first, second, and third NMOS transistors are connected to the second base voltage. The two cross-connected PMOS transistors include a first PMOS transistor and a second PMOS transistor. A gate terminal of the first PMOS transistor is connected to drain terminals of the second PMOS transistor and the second NMOS transistor. A gate terminal of the second PMOS transistor is connected to drain terminals of the first PMOS transistor and the first NMOS transistor. The gate terminal of the first PMOS transistor is connected to a drain terminal of the output transistor. A gate terminal of the output transistor is connected to the output terminal of the circuit.

In an embodiment, a state definition and retention circuit includes an input terminal, an output terminal, two cross-connected PMOS transistors, first, second, and third NMOS transistors coupled to the two cross-connected PMOS transistors, an inverter circuit, and an output transistor. The second NMOS transistor is connected to the input terminal of the circuit. A drain terminal and a gate terminal of the third NMOS transistor are connected to gate terminals of the two cross-connected PMOS transistors. The two cross-connected PMOS transistors and the first, second, and third NMOS transistors are connected through a first connection node and a second connection node. A voltage at the first connection node increases such that a positive feedback is applied to the second connection node to force a voltage at the second connection node to decrease. The inverter circuit is coupled to the first and second NMOS transistors and to the input terminal. The output transistor is connected to the two cross-connected PMOS transistors and to the output terminal of the circuit. The inverter circuit is connected between a first power supply and a first base voltage. The two cross-connected PMOS transistors, the first, second, and third NMOS transistors, and the output transistor are connected between a second power supply and a second base voltage. The two cross-connected PMOS transistors include a first PMOS transistor and a second PMOS transistor. A gate terminal of the first PMOS transistor is connected to drain terminals of the second PMOS transistor and the second NMOS transistor. A gate terminal of the second PMOS transistor is connected to drain terminals of the first PMOS transistor and the first NMOS transistor. The gate terminal of the first PMOS transistor is connected to a drain terminal of the output transistor. A gate terminal of the output transistor is connected to the output terminal of the circuit.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
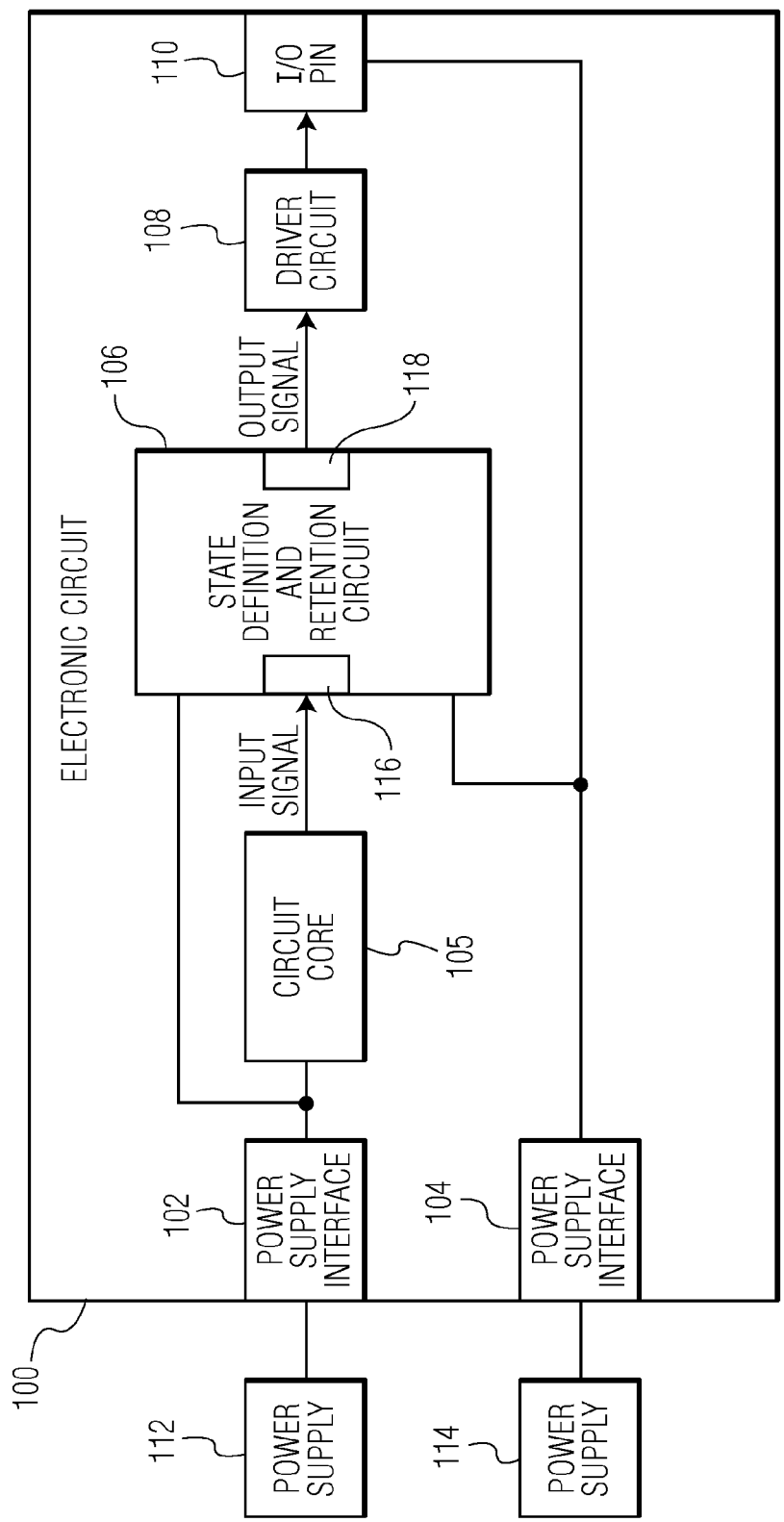
FIG. 1 is a schematic block diagram of an electronic circuit in accordance with an embodiment of the invention.

FIG. 1 is a schematic block diagram of an electronic circuit 100 in accordance with an embodiment of the invention. The electronic circuit may be used for various devices and applications, such as computers, industrial machineries, and appliances. For example, the electronic circuit may be used in microcontrollers for computers, industrial machineries, and appliances. The electronic circuit may be included within an IC circuit or any other type of circuit. The electronic circuit can be used to bridge between power supply domains. For example, the electronic circuit can be used in level shifters that bridge between different core power supply domains, between a core power supply domain to an I/O power supply domain, or between different I/O power supply domains. The electronic circuit can be used to save power during a power sequencing event. In the embodiment depicted in FIG. 1, the electronic circuit includes a first power supply interface 102, a second power supply interface 104, a circuit core 105, a state definition and retention circuit 106, a driver circuit 108, and an I/O pin 110. Although the electronic circuit is depicted and described with certain components and functionality, other embodiments of the electronic circuit may include fewer or more components to implement less or more functionality. For example, the electronic circuit may include more than or less than two power supply interfaces, multiple state definition and retention circuits, multiple driver circuits, and/or multiple I/O pins. In another example, the electronic circuit may include a load circuit (not shown) connected to the I/O pin 110, which can be any type of electrical load. For example, the load circuit may include a capacitive load, a resistive load, and/or an inductive load.

The power supply interfaces 102, 104 interface with the power supplies 112, 114 that supply power to the electronic circuit 100. The power supplies may be any type of power supplies. In the embodiment depicted in FIG. 1, the power supply 112 is a core power supply that supplies power to the circuit core 105, which includes a core portion of the electronic circuit, and the power supply 114 is an I/O power supply that supplies power to an I/O portion of the electronic circuit. Both the core power supply and the I/O power supply supply power to the state definition and retention circuit 106. In an embodiment, the state definition and retention circuit 106 includes power supply interfaces configured to interface with the power supplies 112, 114. In an example, the supply voltage of the core power supply is in the range between 1.2V and 1.5V and the supply voltage of the I/O power supply is in the range between 1.8V and 3.6V. However, voltages of the power supplies 112, 114 are not restricted to the ranges between 1.2V and 1.5V and between 1.8V and 3.6V. Further, the power supplies 112, 114 are not restricted to the combination of a core power supply and an I/O power supply. In an embodiment, at least one of the power supplies may be a battery power supply, such as a lithium battery or any other type of battery, or other type of power supply that can supply a limited amount of power.

The circuit core 105 of the electronic circuit 100 includes core circuit components such as signal processing logic. The driver circuit 108 of the electronic circuit 100 is connected to the state definition and retention circuit 106 and to the I/O pin 110. The driver circuit is configured to supply an output signal from the state definition and retention circuit 106 to the I/O pin. The driver circuit can be any type of electrical driver. The I/O pin of the electronic circuit 100 is configured to receive an input signal from an external device or to present an output signal to an external device. For example, the I/O pin can present the output signal from the state definition and retention circuit 106 to an external device.

The state definition and retention circuit 106 of the electronic circuit 100 is configured to define and retain a state of the electronic circuit. The state of the electronic circuit may be a current or previous logical level of an input signal to the electronic circuit and/or to the state definition and retention circuit 106, a current or previous logical level of an output signal from the electronic circuit and/or from the state definition and retention circuit 106, a current or previous logical level of a node at the electronic circuit and/or the state definition and retention circuit 106, or any other state, value, or level of the electronic circuit and/or the state definition and retention circuit 106. In the embodiment depicted in FIG. 1, the state definition and retention circuit 106 receives at least one input signal/input data from the circuit core 105 through an input terminal 116, defines a state of the electronic circuit based on the input signal/data, and outputs the state of the electronic circuit in at least one output signal/output data through an output terminal 118. However, in some other embodiments, the state definition and retention circuit 106 receives at least one input signal from the circuit core and an input signal from an external environment, defines a state of the electronic circuit based on the input signals, and outputs the state of the electronic circuit in at least one output signal. The input terminal 116 and the output terminal 118 may include I/O interfaces, I/O pins, or other suitable I/O devices. The state definition and retention circuit 106 may be, for example, a circuit within an IC circuit, or any other type of circuit. In an embodiment, the state definition and retention circuit 106 may be a level shifter with a state definition and retention feature, which is part of a standard cell library. In another embodiment, the state definition and retention circuit 106 is a bus holder circuit. The state definition and retention circuit 106 can be used for different types of electronic devices such as low power devices. In an embodiment, the state definition and retention circuit 100 is used for an ultra low power device. Examples of an ultra low power device include, without limitation, battery powered small appliances such as hearing aids. The state definition and retention circuit may be a single device/circuit that is implemented on a single substrate or may consist of a network of devices that are implemented in separate substrates.

In the embodiment depicted in FIG. 1, the state definition and retention circuit 106 serves as an interface between the power supplies 112, 114. In an embodiment, the state definition and retention circuit 106 retains or keeps a circuit state value in the absence of power from one of the power supplies 112, 114. In addition, the state definition and retention circuit 106 has a voltage level translator or level shifter functionality that converts a signal from one power supply voltage to another. Typically I/O components operate at higher supply voltages (e.g., 1.8V-3.6V) for compatibility with an external environment while core components operate at lower supply voltages (e.g., 1.2V-1.5V) to reduce power consumption. Therefore, signals need to be level shifted from the core supply level to the I/O supply level or from the I/O supply level to the core supply level. The state definition and retention circuit 106 can be used to level shift signals from the core supply level to the I/O supply level or from the I/O supply level to the core supply level. In the embodiment depicted in FIG. 1, the state definition and retention circuit 106 can define the state of the I/O pin 110 when power is supplied to the state definition and retention circuit 106 from the I/O power supply 114 and power is not supplied to the state definition and retention circuit 106 from the core power supply 112, for example, when the I/O power supply is turned on or switched on in the absence of the core power supply or when the core power supply is disconnected from the state definition and retention circuit 106. Specifically, the state definition and retention circuit 106 defines its output signal, which in turn defines the state of the I/O pin 110 to a desired logical level. In an embodiment, the state definition and retention circuit 106 defines states of one or more nodes of the electronic circuit 100 to logic levels such as high/low (e.g., supply voltage/ground). The state definition and retention circuit 106 can define the I/O pin as being high impedance or as exhibiting a valid logic level such as high/low (e.g., supply voltage/ground). For example, the state definition and retention circuit 106 can define the state of the I/O pin as being high impedance when the I/O power supply is turned on in the absence of the core power supply or when the core power supply is disconnected from the state definition and retention circuit 106. The state definition and retention circuit 106 can retain the state of the I/O pin when the core power supply is turned off or switched off. For example, the state definition and retention circuit 106 keeps the previous logic level such as high/low (e.g., supply voltage/the ground) of an internal node of the electronic circuit 100. Because the state of the I/O pin can be retained by the state definition and retention circuit 106 when the core power supply is turned off, the state of the I/O pin is predictable when the core power supply is restored.

In a conventional state definition and retention circuit, back-to-back inverters are connected across a level shifter to form a latch configuration, which retains the state of I/O pins in the absence of a core power supply. The state definition of the I/O pins is achieved by designing the back-to-back inverters such that the size of a PMOS transistor of one inverter is much larger than the size of its corresponding NMOS transistor and such that the size of an NMOS transistor of the other inverter is much larger than the size of its corresponding PMOS transistor. However, there are some disadvantages associated with such a state definition and retention circuit. For example, the latch configuration formed by back-to-back inverters can exhibit multiple DC solutions during power supply ramp-up because the output signal of the latch configuration can be controlled by both the PMOS and the NMOS transistors. For example, the output of the latch configuration may settle to logical high (e.g., supply voltage) or logical low (e.g., the ground) or between logical high and logical low (e.g., between supply voltage and the ground) when a supply voltage from only one of the power supplies is applied to the conventional state definition and retention circuit. If the latch configuration settles to a particular one of the DC solutions, the conventional state definition and retention circuit may exhibit an undesired static current, which could lead to undesired pin leakage current. In addition, skewed device sizes can cause duty cycle distortion, thereby rendering the state definition and retention circuit unsuitable for data path usage.

In an embodiment, the state definition and retention circuit 106 includes two cross-connected PMOS transistors, first, second, and third NMOS transistors coupled to the two cross-connected PMOS transistors, an inverter circuit coupled to the first and second NMOS transistors and to an input terminal of the state definition and retention circuit 106, and an output transistor connected to the two cross-connected PMOS transistors and to an output terminal of the state definition and retention circuit. The second NMOS transistor is connected to the input terminal of the circuit. The drain terminal and the gate terminal of the third NMOS transistor are connected to gate terminals of the two cross-connected PMOS transistors. The inverter circuit is connected between a first power supply and a first base voltage. The two cross-connected PMOS transistors, the first, second, and third NMOS transistors, and the output transistor are connected between a second power supply and a second base voltage. In one embodiment, the two cross-connected PMOS transistors and the third NMOS transistor cause a ramp-up condition in which the voltage at a first connection node between the PMOS transistors and the NMOS transistors rises towards the maximum supply voltage across the power supplies 112, 114 and a positive feedback is created and applied to a second connection node between the PMOS transistors and the NMOS transistors to force the voltage at the second connection node to decrease. Specifically, in an embodiment, the connections between the two cross-connected PMOS transistors and the third NMOS transistors cause the voltage to rise to the maximum voltage across one of the cross-connected PMOS transistors and to drop to ground across the other cross-connected PMOS transistor. Because the voltage across one of the cross-connected PMOS transistors is assured to rise to the maximum voltage while the voltage across the other cross-connected PMOS transistor is assured to drop to ground, the state definition and retention circuit 106 is certain to settle at a single DC solution. The configuration of the two cross-connected PMOS transistors and the third NMOS transistors does not utilize back-to-back inverters and therefore avoids the associated drawbacks while providing state definition with a single DC solution.

Compared with a conventional state definition and retention circuit, the state definition and retention circuit 106 exhibits numerous advantages, which are described below with reference to FIGS. 2-4. One of the advantages is that the state definition and retention circuit 106 has a single solution when a supply voltage from only one of the power supplies 112, 114 is applied to the state definition and retention circuit 106. For example, the state definition and retention circuit 106 has a single DC solution. By having a single DC solution, each state of the state definition and retention circuit 106 has only one possible value, such as logical high or logical low at a particular time or situation. In other words, each state of the state definition and retention circuit 106 is defined to a single value, such as logical high or logical low, at a particular time or situation. Logical high and logical low of a state can be translated into logical high, logical low, or high impedance for a corresponding I/O pin. Compared with multiple DC solutions, a single DC solution does not allow a state of the state definition and retention circuit 106 to be uncertain when a supply voltage from only one of the power supplies 112, 114 is applied to the state definition and retention circuit 106. For example, the state definition and retention circuit 106 has a single DC solution during power supply ramp-up and avoids undesired power dissipation during ramp-up of one power supply in the absence of the other power supply. In addition, the state definition and retention circuit 106 is designed independent of device size, device manufacturing process, device operating voltage, and/or device working temperature. Furthermore, the state definition and retention circuit 106 has no static current and can be fabricated using baseline Complementary Metal Oxide Semiconductor (CMOS) processes without the need for any specific process options that may result in additional manufacturing costs. Additionally, the state definition and retention circuit 106 has relatively few electronic components. Because of the low number of electronic components, the state definition and retention circuit 106 is simple to implement and requires less real estate (i.e., circuit area) than conventional circuits.

Figure 2:
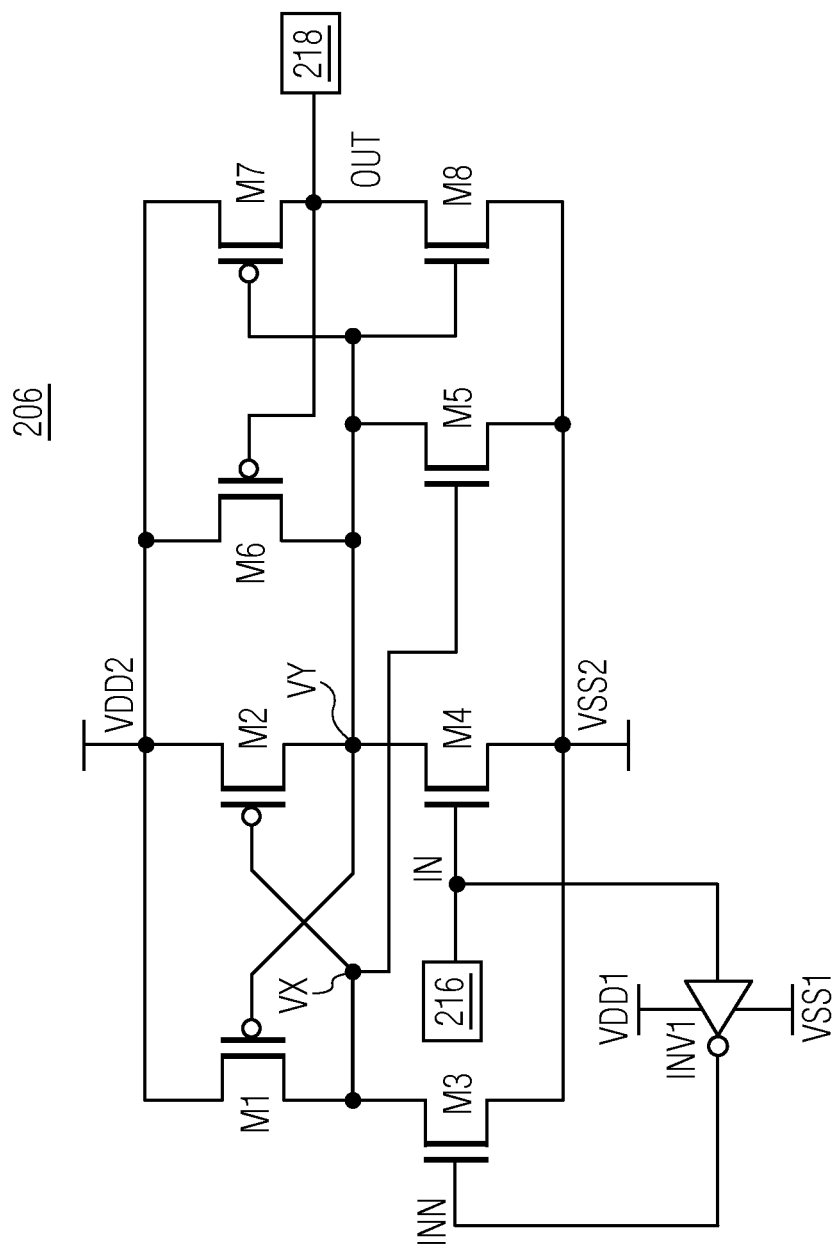
FIG. 2 depicts an embodiment of the state definition and retention circuit of FIG. 1.
Figure 3:
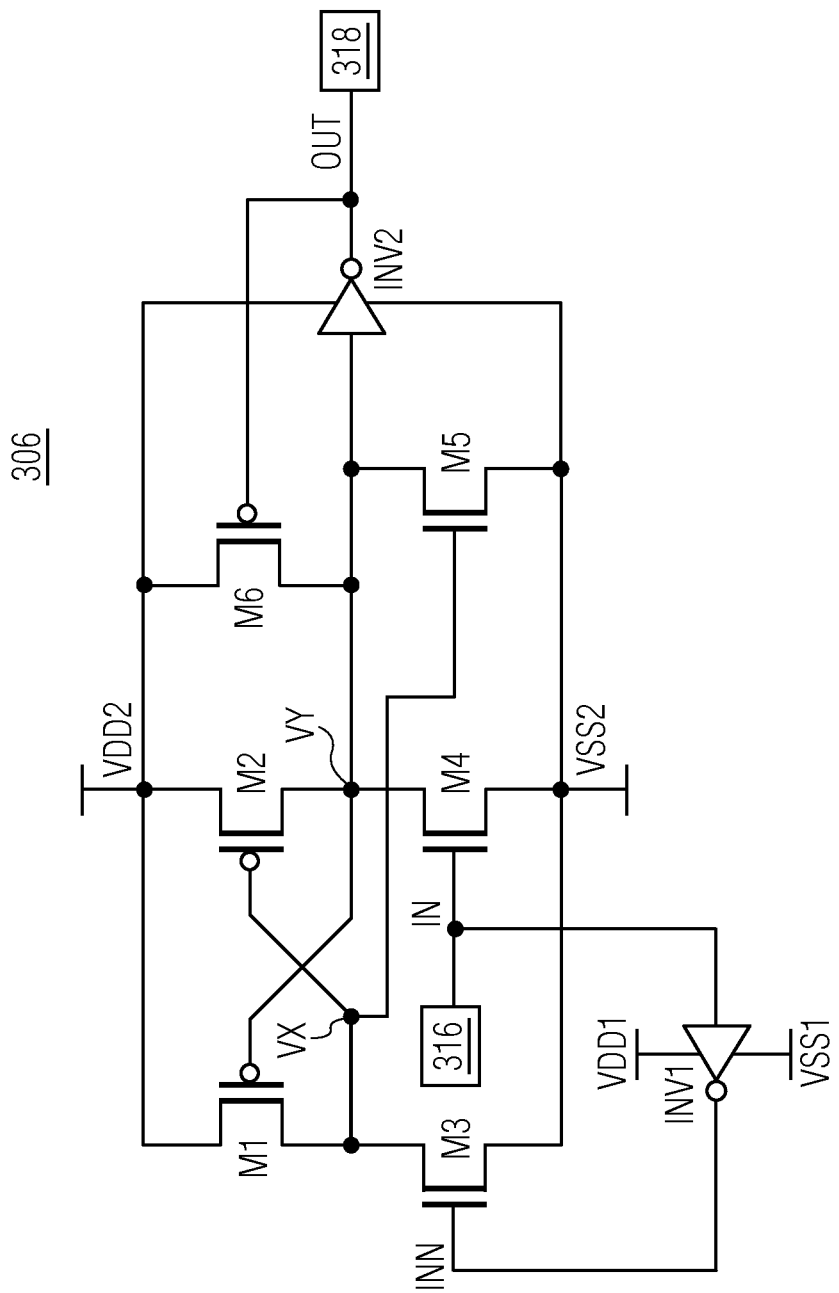
FIG. 3 depicts another embodiment of the state definition and retention circuit of FIG. 1.
Figure 4:
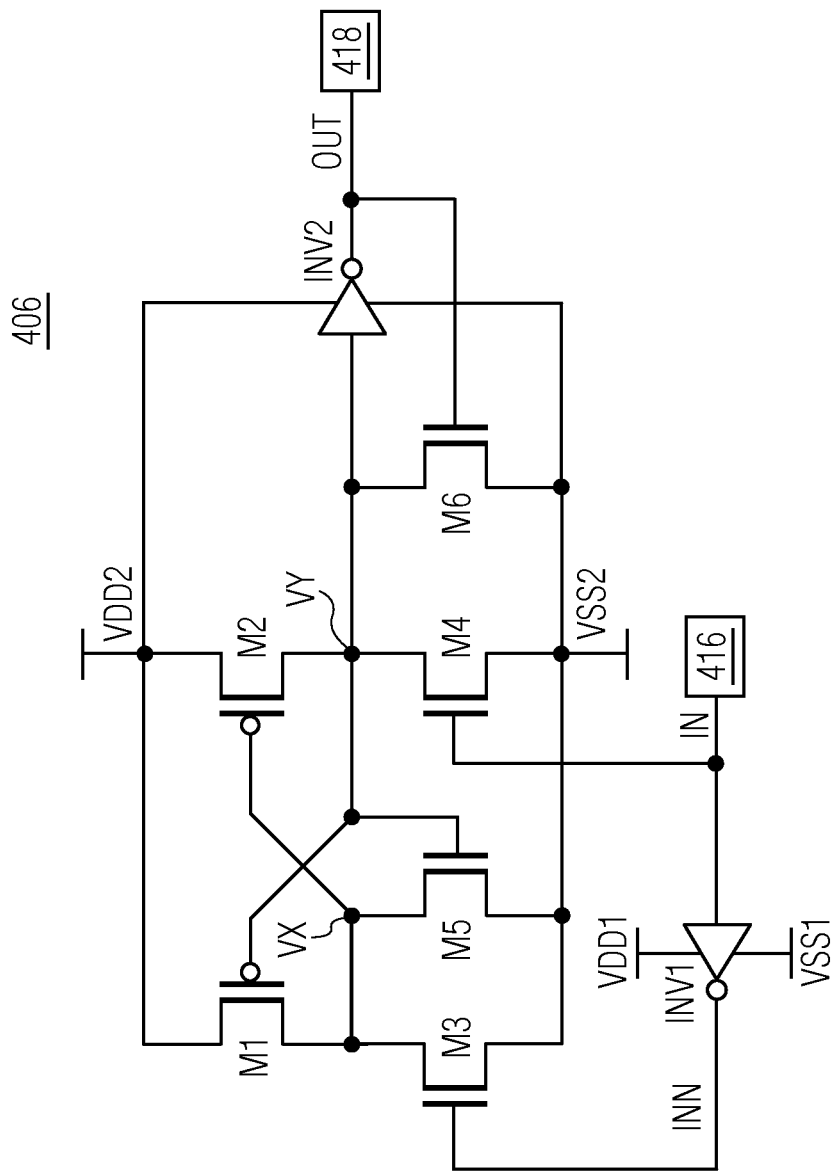
FIG. 4 depicts another embodiment of the state definition and retention circuit of FIG. 1.

FIGS. 2-4 depict some embodiments of the state definition and retention circuit 106 of FIG. 1. However, the state definition and retention circuit 106 is not restricted to the embodiments depicted in FIGS. 2-4. In the embodiments depicted in FIGS. 2-4, the core power supply 112 is applied to a terminal marked "VDD1" and the I/O power supply 114 is applied to a terminal marked "VDD2." Base voltages are applied to terminals marked "VSS1" and "VSS2." In an embodiment, the terminals VSS1 and VSS2 are connected to the ground. In the embodiments depicted in FIGS. 2-4, a state definition and retention circuit 206, 306, or 406 serves as an interface between the power supplies 112, 114. The state definition and retention circuit 206, 306, or 406 receives an input signal marked "IN" from an input terminal 216, 316, or 416, respectively, and outputs an output signal marked "OUT" through an output terminal 218, 318, or 418, respectively. The input terminals 216, 316, 416 and the output terminals 218, 318, 418 may include I/O interfaces, I/O pins, or other suitable I/O devices. The input signal IN, which swings between the voltages at the terminals VSS1 and VDD1, is converted to the output signal OUT, which swings between the voltages at the terminals VSS2 and VDD2. As the output signal OUT is defined by the state definition and retention circuit 206, 306, or 406, the state of the I/O pin 110 is defined to a desired logical level.

FIG. 2 depicts a first embodiment of the state definition and retention circuit 106 of FIG. 1. In the embodiment depicted in FIG. 2, the state definition and retention circuit 206 includes transistors M1-M8 and an inverter circuit INV1. Specifically, transistors M1, M2, M6 and M7 are PMOS transistors while transistors M3, M4, M5 and M8 are NMOS transistors. The PMOS transistors M1 and M2 are cross-connected. The gate terminal of the PMOS transistor M1 is connected to the drain terminal of the PMOS transistor M2, and the gate terminal of the PMOS transistor M2 is connected to the drain terminal of the PMOS transistor M1. The gate terminal of the PMOS transistor M1 is connected to the drain terminal of the NMOS transistor M4 while the gate terminal of the PMOS transistor M2 is connected to the drain terminal of the NMOS transistor M3. The PMOS transistors M1, M2, M6 and M7 and the NMOS transistors M3, M4, M5 and M8 are connected through connection points marked "VX" and "VY." The inverter circuit INV1 is connected to the terminal VDD1 and another terminal marked "VSS1." The transistors M1, M2, M6 and M7 are connected to the terminal VDD2 while the transistors M3, M4, M5, and M8 are connected to a terminal marked "VSS2." In the embodiment depicted in FIG. 2, the gate terminal of the PMOS transistor M1 is connected to drain terminals of the PMOS transistors M2 and M6 and the NMOS transistors M4 and M5, and to gate terminals of the PMOS transistor M7 and the NMOS transistor M8 through connection node VY. The gate terminal of the PMOS transistor M2 is connected to drain terminals of the PMOS transistor M1 and the NMOS transistor M3 and to the gate terminal of the NMOS transistor M5 through connection node marked VX. The gate terminal of the PMOS transistor M6 is connected to drain terminals of the PMOS transistor M7 and the NMOS transistor M8 and to the output terminal 218 of the state definition and retention circuit 206, from which an output signal marked "OUT" is outputted. PMOS transistor M6 is also referred to as an output transistor. The gate terminal of the NMOS transistor M4 is connected to an input terminal of the inverter circuit INV1 and to the input terminal 216 of the state definition and retention circuit 206, from which an input signal "IN" is received. The gate terminal of the NMOS transistor M3 is connected to the output terminal of the inverter circuit INV1. The transistors M1, M2, M3 and M4 form a cross coupled level shifter and the transistors M7 and M8 form a CMOS inverter. The inverter INV1 inverts the input signal IN into a signal marked "INN." In other words, in the embodiment depicted in FIG. 2, the signal INN is the inverted version of the input signal IN. However, in some other embodiments, the signal INN may be inputted from outside the state definition and retention circuit 206. Although the state definition and retention circuit 206 is depicted and described with certain components and functionality, other embodiments of the state definition and retention circuit 206 may include fewer or more components to implement less or more functionality. For example, the state definition and retention circuit 206 may include more than eight or less than eight transistors and/or multiple inverters.

In a normal operation mode of the state definition and retention circuit 206, the power supply voltages of the power supplies 112 and 114 are applied to the terminals VDD1 and VDD2. In the normal operation mode, the state definition and retention circuit 206 behaves as a signal level shifter in the presence of the power supply voltages at the terminals VDD1 and VDD2. The input signal IN, which swings between the voltages at the terminals VSS1 and VDD1, is converted to the output signal OUT, which swings between the voltages at the terminals VSS2 and VDD2.

In a state definition or "power up" operation mode of the state definition and retention circuit 206, the power supply voltage of the core power supply 112 is not applied to the terminal VDD1 while the power supply voltage of the I/O power supply 114 is applied at the terminal VDD2. In other words, the core power supply is absent while the I/O power supply is powered up in the state definition operation mode. A voltage at connection node VX increases and creates a positive feedback, which is applied to connection node VY to force a voltage at connection node VY to decrease. For example, the voltage at connection node VX is only controlled by the PMOS transistor M1. This way, the voltage at connection node VX can only change toward the voltage at the terminal VDD2 and the voltage at connection node VY can only change toward zero by the positive feedback from connection node VX. As the voltage at connection node VX goes high, the NMOS transistor M5 turns on and pulls down the voltage at connection node VY. The NMOS transistor M5 increases the voltage difference between the gate terminal and the drain terminal of the PMOS transistor M1 and pushes the voltage at connection node VX to the voltage at the terminal VDD2. Specifically, in the absence of the power supply voltages at the terminals VDD1 and VDD2, the voltages at connection nodes VX and VY of the state definition and retention circuit 206 are settled to zero. As the power supply voltage at the terminal VDD2 ramps-up to the voltage level of the I/O power supply 114 in the absence of the power supply voltage at the terminal VDD1, the voltages at connection nodes VX and VY also ramp-up as the PMOS transistors M1 and M2 get enough gate oxide overdrive. The NMOS transistor M5 is turned on when the voltage at connection node VX reaches a threshold voltage $V_T$ of the NMOS transistor M5, which is the voltage required to be applied on the gate of the NMOS transistor M5 to invert the channel such that the NMOS transistor M5 conducts, and discharges the voltage at connection node VY to the voltage at the terminal VSS2. As the voltage at connection node VY goes lower than the voltage at connection node VX, the transistor M1 gets higher gate overdrive and charges connection node VX, which in turn makes the voltage at the transistor M2 weaker and the voltage at connection node VY discharges faster. Thus, the state definition and retention circuit 206 provides a positive feedback as soon as the voltage at connection node VX reaches the threshold voltage. As such, the voltage at connection node VX monotonically increases such that a positive feedback is applied to connection node VY to force a voltage at connection node VY to monotonically decrease, which causes the state definition and retention circuit 206 to have a definitive output signal, which is logical high or logical low. For example, the output signal OUT can reach the voltage level at the terminal VDD2 and define the output state to be logical high.

In a state retention or "power-down" operation mode of the state definition and retention circuit 206, the power supply voltage of the core power supply 112 applied to the terminal VDD1 decreases while the power supply voltage of the I/O power supply 114 is applied at the terminal VDD2. In other words, the core power supply is powered down while the I/O power supply is applied at the terminal VDD2 in the state retention operation mode. In the state retention operation mode, the transistor M6 holds the voltage at connection node VY to the power supply voltage applied at the terminal VDD2 and retains a logic low at the output signal OUT in the absence of the power supply voltage at the terminal VDD1. A previous logic low in which the input voltage IN is equal to the voltage at the terminal VSS1 is retained by the transistor M6. The transistor M5 retains a previous logic high in which the input voltage IN is equal to the voltage at the terminal VDD1 by holding the voltage at connection node VY to the voltage at the terminal VSS2 in the absence of the core power supply. The logical state of the state definition and retention circuit 206 is retained because the previous state of the input signal IN is retained at the output terminal 218 as the output signal OUT.

In an embodiment, the transistors M7 and M8 are replaced by another circuit such as an inverter circuit. FIG. 3 depicted a second embodiment of the state definition and retention circuit 106 of FIG. 1 in which the transistors M7 and M8 are replaced by an inverter circuit marked "INV2." In the embodiment depicted in FIG. 3, the state definition and retention circuit 306 includes transistors M1-M6 and inverter circuits INV1 and INV2. The operation of the state definition and retention circuit 306 is similar to the operation of the state definition and retention circuit 206. For example, similar to or the same as the state definition and retention circuit 206 described above, the state definition and retention circuit 306 can operate in a normal operation mode, a state definition operation mode, and a state retention operation mode. In the state definition operation mode of the state definition and retention circuit 306, the power supply voltage of the core power supply 112 is not applied to the terminal VDD1 while the power supply voltage of the I/O power supply 114 is applied at the terminal VDD2. A voltage at connection node VX increases and creates a positive feedback, which is applied to connection node VY to force a voltage at connection node VY to decrease. For example, voltage at connection node VX is only controlled by the PMOS transistor M1. This way, the voltage at connection node VX can only change toward the voltage at the terminal VDD2 and the voltage at connection node VY can only change toward zero by the positive feedback from connection node VX. As the voltage at connection node VX goes high, the NMOS transistor M5 turns on and pulls down the voltage at connection node VY. The NMOS transistor M5 increases the voltage difference between gate terminal and drain terminal of the PMOS transistor M1 and pushes the voltage at connection node VX to the voltage at the terminal VDD2.

FIG. 4 depicts a third embodiment of the state definition and retention circuit 106 of FIG. 1. In the embodiment depicted in FIG. 4, the state definition and retention circuit 406 includes transistors M1-M6 and inverter circuits INV1 and INV2. Specifically, transistors M1 and M2 are PMOS transistors and transistors M3-M6 are NMOS transistors. The PMOS transistors M1 and M2 are cross-connected. The gate terminal of the PMOS transistor M1 is connected to the drain terminal of the PMOS transistor M2, and the gate terminal of the PMOS transistor M2 is connected to the drain terminal of the PMOS transistor M1. The gate terminal of the PMOS transistor M1 is connected to the drain terminal of the NMOS transistor M4 while the gate terminal of the PMOS transistor M2 is connected to the drain terminal of the NMOS transistor M3. The PMOS transistors M1 and M2 and the NMOS transistors M3-M6 are connected through connection points marked "VX" and "VY." The transistors M1, M2, M3 and M4 form a cross coupled level shifter. The inverter circuit INV1 is connected to the terminal VDD1 and another terminal marked "VSS1." The transistors M1 and M2 are connected to the terminal VDD2 while the transistors M3-M6 are connected to a terminal marked "VSS2." Base voltages are applied to the terminals VSS1 and VSS2. In an embodiment, the terminals VSS1 and VSS2 are connected to the ground. In the embodiment depicted in FIG. 4, the gate terminal of the PMOS transistor M1 is connected to drain terminals of the PMOS transistor M2 and the NMOS transistors M4 and M6, to the gate terminal of the NMOS transistor M5, and to an input terminal of the inverter circuit INV2 through connection node marked VY. The gate terminal of the PMOS transistor M2 is connected to drain terminals of the PMOS transistor M1 and the NMOS transistors M3 and M5 through connection node marked VX. The gate terminal of the NMOS transistor M4 is connected to an input terminal of the inverter circuit INV1 and to the input terminal 416 of the state definition and retention circuit 406, from which an input signal "IN" is received. The gate terminal of the NMOS transistor M3 is connected to an output terminal of the inverter circuit INV1. The gate terminal of the NMOS transistor M6 is connected to an output terminal of the inverter circuit INV2 and to the output terminal 418 of the state definition and retention circuit 406, from which an output signal marked "OUT" is outputted. NMOS transistor M6 is also referred to as an output transistor. The inverter INV1 inverts the input signal IN into a signal marked "INN." In other words, in the embodiment depicted in FIG. 4, the signal INN is an inverted version of the input signal IN. However, in some other embodiments, the signal INN may be inputted from outside the state definition and retention circuit 406. Although the state definition and retention circuit 406 is depicted and described with certain components and functionality, other embodiments of the state definition and retention circuit 406 may include fewer or more components to implement less or more functionality. For example, the state definition and retention circuit 406 may include more than six or less than six transistors and/or more than or less than two inverters.

The state definition and retention circuit 406 depicted in FIG. 4 is similar to the state definition and retention circuits 206, 306 depicted in FIGS. 2 and 3. However, in the state definition and retention circuit 406 depicted in FIG. 4, the gate terminal of the PMOS transistor M1 is connected to the gate terminal of the NMOS transistor M5 as opposed to the drain terminal of the NMOS transistor M5 while the gate terminal of the PMOS transistor M2 is connected to the drain terminal of the NMOS transistor M5 as opposed to the gate terminal of the NMOS transistor M5. As a result of the configuration of the transistors M1, M2, and M5, when the power supply voltage at the terminal VDD2 ramps-up in the absence of the power supply voltage at the terminal VDD1, a voltage at connection node VY increases and creates a positive feedback, which is applied to connection node VX to force a voltage at connection node VX to decrease.

In a normal operation mode of the state definition and retention circuit 406, the power supply voltages of the power supplies 112 and 114 are applied to the terminals VDD1 and VDD2. In the normal operation mode, the state definition and retention circuit 406 behaves as a signal level shifter in the presence of the power supply voltages at the terminals VDD1 and VDD2. The input signal IN, which swings between the voltages at the terminals VSS1 and VDD1, is converted to the output signal OUT, which swings between the voltages at the terminals VSS2 and VDD2.

In a state definition or "power up" operation mode of the state definition and retention circuit 406, the power supply voltage of the core power supply 112 is not applied to the terminal VDD1 while the power supply voltage of the I/O power supply 114 is applied at the terminal VDD2. In other words, the core power supply is absent while the I/O power supply is powered up in the state definition operation mode. In the embodiment depicted in FIG. 4, a voltage at connection node VY increases and creates a positive feedback, which is applied to connection node VX to force a voltage at connection node VX to decrease. Specifically, in the absence of the power supply voltages at the terminals VDD1 and VDD2, the voltages at connection nodes marked "VX" and "VY" of the state definition and retention circuit 406 are settled to zero. As the power supply voltage at the terminal VDD2 ramps-up in the absence of the power supply voltage at the terminal VDD1, voltages at connection nodes VX and VY also ramp-up as the PMOS transistors M1 and M2 get enough gate oxide overdrive. The NMOS transistor M5 turns on when the voltage at connection node VY reaches a threshold voltage $V_T$ of the NMOS transistor M5, which is the voltage required to be applied on the gate of the NMOS transistor M5 to invert the channel such that the NMOS transistor M5 conducts, and discharges the voltage at connection node VX to the voltage at the terminal VSS2. As the voltage at connection node VX goes lower than the voltage at connection node VY, the transistor M2 gets higher gate overdrive and charges connection node VY, which in turn makes the voltage at the transistor M1 weaker and the voltage at connection node VX discharges faster. As such, the voltage at connection node VY monotonically increases such that a positive feedback is applied to connection node VX to force a voltage at connection node VX to monotonically decrease, which causes the state definition and retention circuit 406 to have a definitive output signal, which is logical high or logical low.

In a state retention or "power down" operation mode of the state definition and retention circuit 406, the power supply voltage of the core power supply 112 applied to the terminal VDD1 decreases while the power supply voltage of the I/O power supply 114 is applied at the terminal VDD2. In other words, the core power supply is powered down while the I/O power supply is applied at the terminal VDD2 in the state retention operation mode. In the state retention operation mode, the transistor M6 holds the voltage at connection node VY to the power supply voltage applied at the terminal VSS2 and retains logic high at the output signal OUT in the absence of the power supply voltage VDD1. If the previous state is logic low, the transistor M5 continues to hold the voltage at connection node VX to the voltage at the terminal VSS2 in the absence of the core power supply. A previous logic low in which the input voltage IN is equal to the voltage at the terminal VSS1 is retained by the transistor M2. The logical state of the state definition and retention circuit 406 is retained because the previous state of the input signal IN is retained by the output signal OUT.

Although specific embodiments of the invention that have been described or depicted include several components described or depicted herein, other embodiments of the invention may include fewer or more components to implement less or more feature.

In addition, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A circuit comprising:
   two cross-connected PMOS transistors;
   first, second, and third NMOS transistors coupled to the two cross-connected PMOS transistors, wherein the second NMOS transistor is connected to an input terminal of the circuit, and wherein a drain terminal and a gate terminal of the third NMOS transistor are connected to gate terminals of the two cross-connected PMOS transistors;
   an inverter circuit coupled to the first and second NMOS transistors and to the input terminal; and
   an output transistor connected to the two cross-connected PMOS transistors and to an output terminal of the circuit,
   wherein the inverter circuit is connected between a first power supply and a first base voltage, and wherein the two cross-connected PMOS transistors, the first, second, and third NMOS transistors, and the output transistor are connected between a second power supply and a second base voltage, wherein the two cross-connected PMOS transistors include a first PMOS transistor and a second PMOS transistor, wherein a gate terminal of the first PMOS transistor is connected to a drain terminal of the second PMOS transistor, and wherein a gate terminal of the second PMOS transistor is connected to a drain terminal of the first PMOS transistor, wherein the gate terminal of the first PMOS transistor is connected to a drain terminal of the second NMOS transistor, wherein the gate terminal of the second PMOS transistor is connected to a drain terminal of the first NMOS transistor, wherein the gate terminal of the first PMOS transistor is connected to a drain terminal of the output transistor, and wherein a gate terminal of the output transistor is connected to the output terminal of the circuit.

2. The circuit of claim 1, wherein the two cross-connected PMOS transistors and the first, second, and third NMOS transistors are connected through a first connection node and a second connection node, and wherein a voltage at the first connection node increases such that a positive feedback is applied to the second connection node to force a voltage at the second connection node to decrease.

3. The circuit of claim 1, wherein the gate terminal of the first PMOS transistor is connected to a drain terminal of the third NMOS transistor, and wherein the gate terminal of the second PMOS transistor is connected to a gate terminal of the third NMOS transistor.

4. The circuit of claim 1, wherein the gate terminal of the first PMOS transistor is connected to a gate terminal of the third NMOS transistor, and wherein the gate terminal of the second PMOS transistor is connected to a drain terminal of the third NMOS transistor.

5. The circuit of claim 1, wherein the output transistor is a PMOS transistor, and wherein a source terminal of the output transistor is connected to the second power supply.

6. The circuit of claim 5 further comprising a third PMOS transistor and a fourth NMOS transistor, wherein gate terminals of the third PMOS transistor and the fourth NMOS transistor is connected to the gate terminal of the first PMOS transistor, wherein drain terminals of the third PMOS transistor and the fourth NMOS transistor are connected to the output terminal of the circuit, wherein a source terminal of the third PMOS transistor is connected to the second power supply, and wherein a source terminal of the fourth NMOS transistor is connected to the second base voltage.

7. The circuit of claim 5 further comprising a second inverter circuit connected between the second power supply and the second base voltage, wherein an input terminal of the second inverter circuit is connected to the drain terminals of the second PMOS transistor, the output transistor, and the second and third NMOS transistors and to the gate terminal of the first PMOS transistor, and wherein an output terminal of the second inverter circuit is connected to the output terminal of the circuit.

8. The circuit of claim 1, wherein the output transistor is an NMOS transistor, and wherein a source terminal of the output transistor is connected to the second base voltage.

9. The circuit of claim 8 further comprising a second inverter circuit connected between the second power supply and the second base voltage, wherein an input terminal of the second inverter circuit is connected to the drain terminals of the second PMOS transistor, the output transistor, and the second NMOS transistor and to gate terminals of the first PMOS transistor and the third NMOS transistor, and wherein an output terminal of the second inverter circuit is connected to the output terminal of the circuit.

10. The circuit of claim 1, wherein source terminals of the two cross-connected PMOS transistors are connected to the second power supply, and wherein source terminals of the first, second, and third NMOS transistors are connected to the second base voltage.

11. The circuit of claim 1, wherein a gate terminal of the second NMOS transistor is connected to an input terminal of the inverter circuit and to the input terminal of the circuit, and wherein a gate terminal of the first NMOS transistor is connected to an output terminal of the inverter circuit.

12. A circuit comprising:
two cross-connected PMOS transistors;
first, second, and third NMOS transistors coupled to the two cross-connected PMOS transistors, wherein a gate terminal of the second NMOS transistor is connected to an input terminal of the circuit, and wherein a drain terminal and a gate terminal of the third NMOS transistor are connected to gate terminals of the two cross-connected PMOS transistors;
an inverter circuit coupled to the first and second NMOS transistors and to the input terminal, wherein an input terminal of the inverter circuit is connected to the gate terminal of the second NMOS transistor, and wherein an output terminal of the inverter circuit is connected to a gate terminal of the first NMOS transistor; and
an output transistor connected to the two cross-connected PMOS transistors and to an output terminal of the circuit,
wherein the inverter circuit is connected between a first power supply and a first base voltage, wherein the two cross-connected PMOS transistors, the first, second, and third NMOS transistors, and the output transistor are connected between a second power supply and a second base voltage, wherein source terminals of the two cross-connected PMOS transistors are connected to the second power supply, wherein source terminals of the first, second, and third NMOS transistors are connected to the second base voltage, wherein the two cross-connected PMOS transistors include a first PMOS transistor and a second PMOS transistor, wherein a gate terminal of the first PMOS transistor is connected to drain terminals of the second PMOS transistor and the second NMOS transistor, wherein a gate terminal of the second PMOS transistor is connected to drain terminals of the first PMOS transistor and the first NMOS transistor, wherein the gate terminal of the first PMOS transistor is connected to a drain terminal of the output transistor, and wherein a gate terminal of the output transistor is connected to the output terminal of the circuit.

13. The circuit of claim 12, wherein the gate terminal of the first PMOS transistor is connected to a drain terminal of the third NMOS transistor, wherein the gate terminal of the second PMOS transistor is connected to a gate terminal of the third NMOS transistor, wherein the output transistor is a PMOS transistor, and wherein a source terminal of the output transistor is connected to the second power supply.

14. The circuit of claim 13 further comprising a third PMOS transistor and a fourth NMOS transistor, wherein gate terminals of the third PMOS transistor and the fourth NMOS transistor is connected to the gate terminal of the first PMOS transistor, wherein drain terminals of the third PMOS transistor and the fourth NMOS transistor are connected to the output terminal of the circuit, wherein a source terminal of the third PMOS transistor is connected to the second power supply, and wherein a source terminal of the fourth NMOS transistor is connected to the second base voltage.

15. The circuit of claim 13 further comprising a second inverter circuit connected between the second power supply and the second base voltage, wherein an input terminal of the second inverter circuit is connected to the drain terminals of the second PMOS transistor, the output transistor, and the second and third NMOS transistors and to the gate terminal of the first PMOS transistor, and wherein an output terminal of the second inverter circuit is connected to the output terminal of the circuit.

16. The circuit of claim 12, wherein the gate terminal of the first PMOS transistor is connected to a gate terminal of the third NMOS transistor, wherein the gate terminal of the second PMOS transistor is connected to a drain terminal of the third NMOS transistor, wherein the output transistor is an NMOS transistor, wherein a source terminal of the output transistor is connected to the second base voltage, the circuit further comprising a second inverter circuit connected between the second power supply and the second base voltage, wherein an input terminal of the second inverter circuit is connected to the drain terminals of the second PMOS transistor, the output transistor, and the second NMOS transistor and to gate terminals of the first PMOS transistor and the third NMOS transistor, and wherein an output terminal of the second inverter circuit is connected to the output terminal of the circuit.

17. A state definition and retention circuit comprising:
an input terminal;
an output terminal;
two cross-connected PMOS transistors;
first, second, and third NMOS transistors coupled to the two cross-connected PMOS transistors, wherein the second NMOS transistor is connected to the input terminal of the circuit, wherein a drain terminal and a gate terminal of the third NMOS transistor are connected to gate terminals of the two cross-connected PMOS transistors, wherein the two cross-connected PMOS transistors and the first, second, and third NMOS transistors are connected through a first connection node and a second connection node, and wherein a voltage at the first connection node increases such that a positive feedback is applied to the second connection node to force a voltage at the second connection node to decrease;
an inverter circuit coupled to the first and second NMOS transistors and to the input terminal; and
an output transistor connected to the two cross-connected PMOS transistors and to the output terminal of the circuit,
wherein the inverter circuit is connected between a first power supply and a first base voltage, wherein the two cross-connected PMOS transistors, the first, second, and third NMOS transistors, and the output transistor are connected between a second power supply and a second base voltage, wherein the two cross-connected PMOS transistors include a first PMOS transistor and a second PMOS transistor, wherein a gate terminal of the first PMOS transistor is connected to drain terminals of the second PMOS transistor and the second NMOS transistor, wherein a gate terminal of the second PMOS transistor is connected to drain terminals of the first PMOS transistor and the first NMOS transistor, wherein the gate terminal of the first PMOS transistor is connected to a drain terminal of the output transistor, and wherein a gate terminal of the output transistor is connected to the output terminal of the circuit.

* * * * *